United States Patent
Hoerold et al.

(10) Patent No.: US 7,340,710 B1
(45) Date of Patent: Mar. 4, 2008

(54) INTEGRATED CIRCUIT BINNING AND LAYOUT DESIGN SYSTEM

(75) Inventors: Stephan Hoerold, Saratoga, CA (US); Arjun Dutt, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 380 days.

(21) Appl. No.: 11/108,507

(22) Filed: Apr. 18, 2005

(51) Int. Cl.
*G06F 17/50* (2006.01)
*G06F 9/45* (2006.01)

(52) U.S. Cl. .................. 716/12; 716/5; 716/6; 716/13; 716/14

(58) Field of Classification Search ............ 716/12–14, 716/5, 6
See application file for complete search history.

(56) References Cited

U.S. PATENT DOCUMENTS

| | | | |
|---|---|---|---|
| 5,623,608 A | 4/1997 | Ng | 395/250 |
| 5,958,027 A | 9/1999 | Gulick | 710/52 |
| 6,392,747 B1 | 5/2002 | Allen et al. | 356/141.1 |
| 6,510,545 B1 * | 1/2003 | Yee et al. | 716/12 |
| 6,550,045 B1 | 4/2003 | Lu et al. | 716/6 |
| 2002/0076941 A1 * | 6/2002 | Ushiyama et al. | 438/773 |
| 2004/0103386 A1 * | 5/2004 | Becer et al. | 716/13 |
| 2005/0132309 A1 * | 6/2005 | Saxena et al. | 716/4 |
| 2006/0026539 A1 * | 2/2006 | Tetelbaum et al. | 716/2 |
| 2006/0039551 A1 * | 2/2006 | Hossain | 379/417 |
| 2006/0190892 A1 * | 8/2006 | Haridass et al. | 716/10 |

* cited by examiner

*Primary Examiner*—Stacy A Whitmore
*Assistant Examiner*—Magid Y. Dimyan
(74) *Attorney, Agent, or Firm*—Dorsey & Whitney LLP

(57) ABSTRACT

A method for binning and layout of an integrated circuit design which includes providing a table setting forth predefined widths of signal wires and corresponding spacing to shield wires, characterizing effects on timing, noise, and power distribution based on predefined widths and spacing combinations as functions of the length of the signal wire, and laying out the integrated circuit design based upon the predefined widths of signal wires and corresponding spacing to shield wires. The shield wires are adjacent and on both sides of the routed signal wire.

20 Claims, 6 Drawing Sheets

INTEGRATED CIRCUIT BINNING AND LAYOUT DESIGN SYSTEM

BACKGROUND OF THE INVENTION

1. Field of the Invention

The present invention relates to signal path layout and routing and more particularly to binning layout.

2. Description of the Related Art

An integrated circuit typically includes a plurality of generally horizontal layers, each layer having a plurality of components. The components that are to be connected on an integrated circuit form a net, while any component not connected to a particular net is considered to be an obstruction to that net.

One step in the design of an integrated circuit is to select the wire paths to connect the components. The path of the actual connection between the components, known as the wire path, is then defined as the route via which the components are connected.

It is known to use routing tools to provide the path for the actual connection between the components. However, arbitrary routing, as generated by known routing tools, often does not allow the prediction of cross-coupling (i.e., noise) between wire paths and propagation delays (i.e., timing) within a wire path. Instead a post routing analysis is often performed to check noise and timing, after which the routing may need to be changed iteratively to address any noise or timing issues that are identified by the post routing analysis.

After the routing adjustment, the design analyses and corrective actions are iteratively performed on the integrated circuit routing until all or most noise and timing issues have been addressed. To avoid problems related to cross-coupling, many designs use shield wires to shield signal wires from aggressors. Shield wires may also provide a grid to deliver power efficiently to the entire integrated circuit design.

Known routing tools are often blind to power distribution requirements of the design. Known routing tools might create dense routing regions with no room for the power grid or might route poorly by leaving space to compensate for a power grid. These known routing tools often do not allow alternate assignment for even power distribution. Additionally, these routing tools might produce a routed design in which there may not be enough available channel area to insert decoupling capacitors.

Accordingly, it is desirable to provide a methodology which enables a correct by construction physical layout design. Such a methodology would reduce design turn-around and makes the outcome of a routed design more predictable.

SUMMARY OF THE INVENTION

In accordance with the present invention, a binning methodology and layout design methodology is provided. The binning methodology includes a table setting forth specific widths of signal wires and the corresponding spacing to shield wires. The shield wires are adjacent and on both sides of a routed signal wire. The effect on timing, noise, and power distribution based on these predefined widths and spacing combinations are characterized as functions of the length of the signal wire. The layout post processing flow provides a set of consistent tools such as a shield flow tool, a decoupling capacitor insertion tool, a via drop tool, and an engineering change order (ECO) flow tool that comply with the binning methodology.

In one embodiment, the binning table includes widths for the shield wires associated with corresponding signal wires and determines the capacitive effect on the signal wire in question. The binning table also determines the density of power that can be delivered by the shield wires in a particular region.

To avoid routing collisions, wires on any given metal layer are only routed either in horizontal or vertical direction. To allow fully comprehensive routing of a design, adjacent metal layers have opposite routing directions, e.g. metal layer 1 is horizontal, metal layer 2 is vertical, and metal layer 3 is horizontal, and so on. A routing tool needs to follow only the given spacing numbers as calculated for two adjacent signal wires and use any of the allowable wire widths and routing directions as given in the binning methodology. The definition of wire width, wire spacing and routing directions are set forth within the methodology.

The shield flow tool inserts alternate shields adjacent to signals which are possible since the router follows the specific spacing requirements defined by the binning methodology. The shield flow tool also fills wide open spaces uniformly with shield wires. However, the shield flow tool assigns alternating power to the shield wires; much like the shield flow tool does for the signal shields. This improves power distribution and allows the decoupling capacitor tool to insert capacitor cells of various bin sizes to be slid underneath existing shield wires of the corresponding routing bin. The capacitor power connectivity to the lowest metal layer is ensured by predictable shield spacing and alternate assignment. The decoupling capacitor cells are self-contained so as to avoid additional work needed for design-rule-correctness. The tool allows maximum via coverage over a wide range of layout topologies to minimize voltage abnormalities across different part of the design.

Such a methodology provides a plurality of advantages. For example, the binning methodology and layout post-processing flow allow for a consistent correct-by-construction design approach. The methodology provides high quality, pre-characterized noise shielding, signal timing, and power distribution that does not need an iterative design process. The methodology allows shields to be characterized to deliver sufficient power based on the routing topology of an integrated circuit design. The binning methodology allows using a variety of wire sizes with correspondingly sized shield wires; with the methodology it is not necessary to resort to a single wire size to create most densely routed designs. The methodology provides support for correct-by-construction insertion and power connection of decoupling capacitor cells. Additionally, with the methodology, generic routers without shield capabilities can be used.

Additionally, the binning methodology and layout post processing flow of the present invention allows denser routing than other known binning-based methods which apply to grid routing. The present methodology lends itself to shape-based routing and doesn't force routers to stay on grid (which may be rather coarse and restrictive). Staying on grid means that a designer would still adhere to all DRC rules, but might waste space because the design might not go as near to other routing as the present binning method would allow (due to the coarse and restrictive grid). The present methodology encompasses this coarser binning (or in other words, the more restrictive routing might be a subset of the present methodology). However, by using the present binning table and the steps of the flow based on that table, the present methodology allows for more dense routing Additionally, the binning methodology and layout post processing flow of the present invention allows denser routing than other known methods which apply to grid routing. The present methodology lends itself to shape-based routing and does not force routers to stay on a coarse grid. Staying on grid means that a router would still adhere to all DRC rules, but might waste space because the routing might not go as near to other routing as the present binning method would allow. By using the present binning table and the steps of the flow based on that table, the present methodology allows for more dense routing.

In another embodiment, the invention relates to an apparatus for binning and layout of an integrated circuit design which includes a table setting forth predefined widths of signal wires and corresponding spacing to shield wires, means for characterizing effects on timing, noise, and power distribution based on predefined widths and spacing combinations as functions of the length of the signal wire, and means for laying out the integrated circuit design based upon the predefined widths of signal wires and corresponding spacing to shield wires. The shield wires are adjacent and on both sides of a routed signal wire. The table is stored on a computer readable media.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
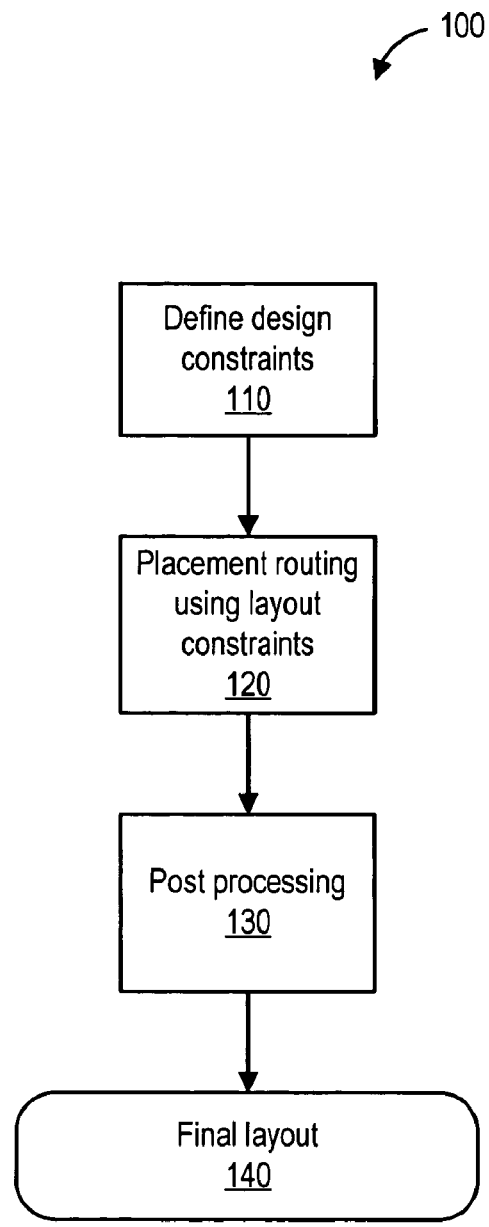
FIG. 1 shows a flow chart of the operation of a system for generating a correct by construction layout.

Referring to FIG. 1, the operation of a system 100 for generating a correct by construction layout is shown. The system 100 starts by defining design constraints to be used within the binning and layout methodology at step 110. Next, the system places routing of an integrated circuit design using the binning and layout design constraints at step 120. After the binning and layout design is completed, the system performs a post processing operation on the binning and layout design at step 130. After the post processing operation is completed, a final design is provided by the system 100 at step 140.

Figure 2:
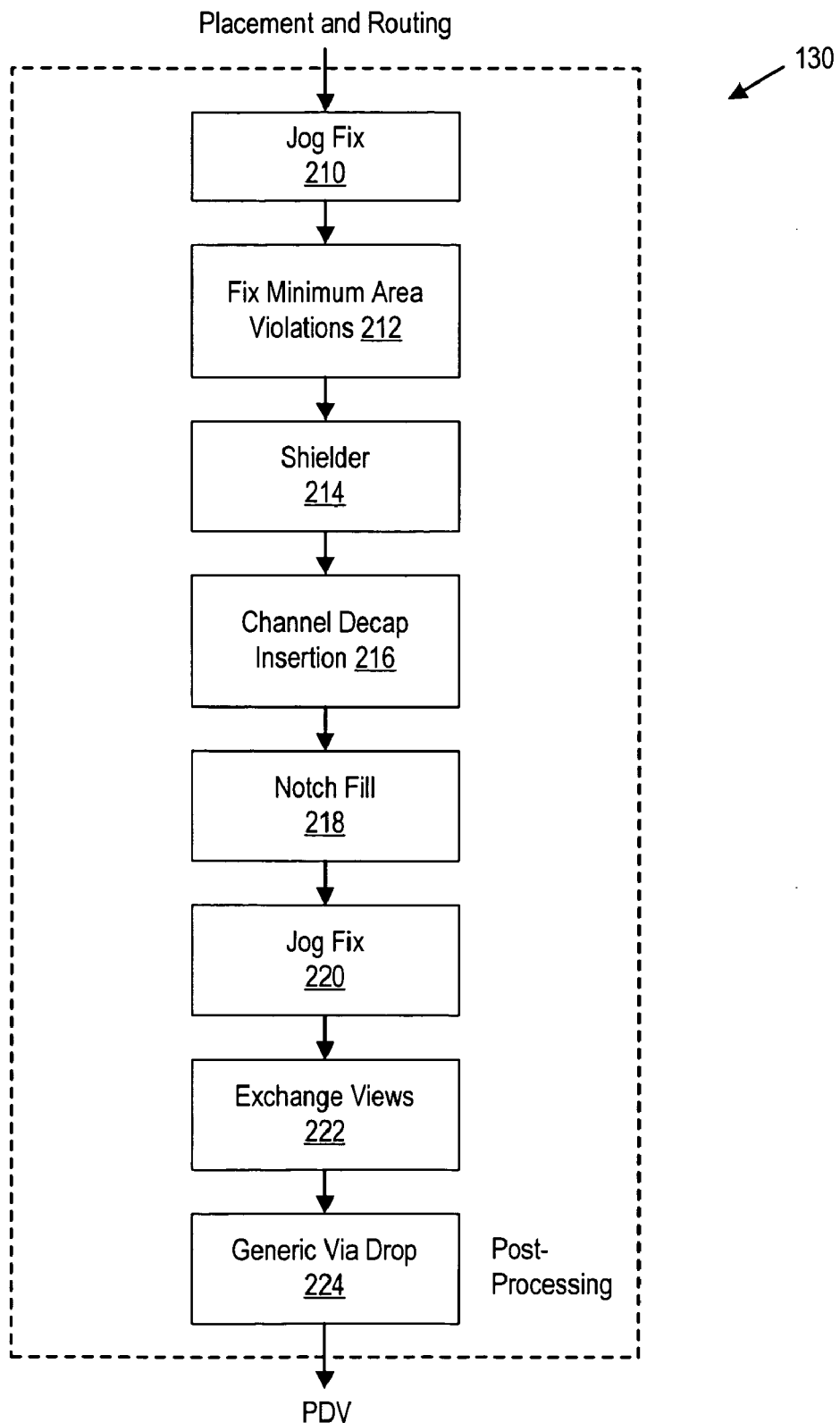
FIG. 2 shows a block diagram of the operation of post processing module of the system for generating a correct by construction layout.

Referring to FIG. 2, a flow chart of the operation of a layout post processing module 130 is shown. More specifically, once a top level layout is substantially completely routed (and repeater inserted where applicable), the layout post processing (LPP) flow is executed to assure that a design complies with various design rules, EM/IR constraints, and noise constraints. The LPP flow executes at various levels of the physical design hierarchy of an integrated circuit chip as long as any hierarchical component complies with the binning methodology. The input design should be error free with respect to the binning methodology and physical design rules as checked by an off-the-shelf design rule checker (DRC), such as Calibre DRC.

More specifically, the layout post processing module 130 starts with a jog fix operation 210. Next, the layout post processing module 130 proceeds to a minimum area violations fix operation 212. Next, the layout post processing module 130 proceeds to a shielder operation 214. Next, the layout post processing module 130 proceeds to a channel decap insertion operation 216. Next the layout post processing module 130 proceeds to a notch fill operation 218. Next the layout post processing module 130 proceeds to another jog fix operation 210. Next, the layout post processing module 130 proceeds to an exchange views operation 222. Next, the layout post processing module 130 proceeds to a generic via drop operation 224.

The jog fix operation 210 prepares an integrated circuit design for shielding. The jog fix operation 210 extends metal edges which otherwise cause jog violations within the design layout.

The minimum area violations fix operation 212 addresses minimum metal area violations which may be due to stacked vias or due to very short wires introduced manually or by an integrated circuit layout designer. The minimum area violations fix operation places properly sized patches on corresponding metal pieces.

The shielder operation 214 provides for signal shielding. The resulting shield wires have alternate net assignment and appropriate labeling. The wires on adjacent layers are interconnected through vias within the shield grid. Wide open spaces are covered with a regular grid of shield wires.

The channel decap insertion operation 216 inserts and places decoupling capacitors underneath existing shielding.

Once the shielding process is completed, the design might have some notch errors. The notch fill operation 218 automatically corrects and addresses any notch errors.

The next jog fix operation 220 is used to fix jogs that might be introduced due to shields.

The exchange views operation 222 replaces all abstract views with layout data. An abstract view provides an abstracted design view of a physical layout design. The abstracted design view provides views of shapes that are important for correct routing (i.e. the process of routing wires).

The generic via drop operation 224 allows interconnection of the power grids of sub-blocks, clock, and shielding to the local power grid covering an entire block of an integrated circuit design by placing instances of vias. A via provides an electrical connection between two consecutive metal layers. An instance of a via that is correct by construction is used in that the correct by construction via include a via cut (or array of via cuts) and associated stubs of metal area that satisfy minimum cut enclosure requirements.

Any of the layout post processing operations may be rerun as needed. A corresponding cell that is changed via the layout post processing operation is automatically rerun.

Figure 3:
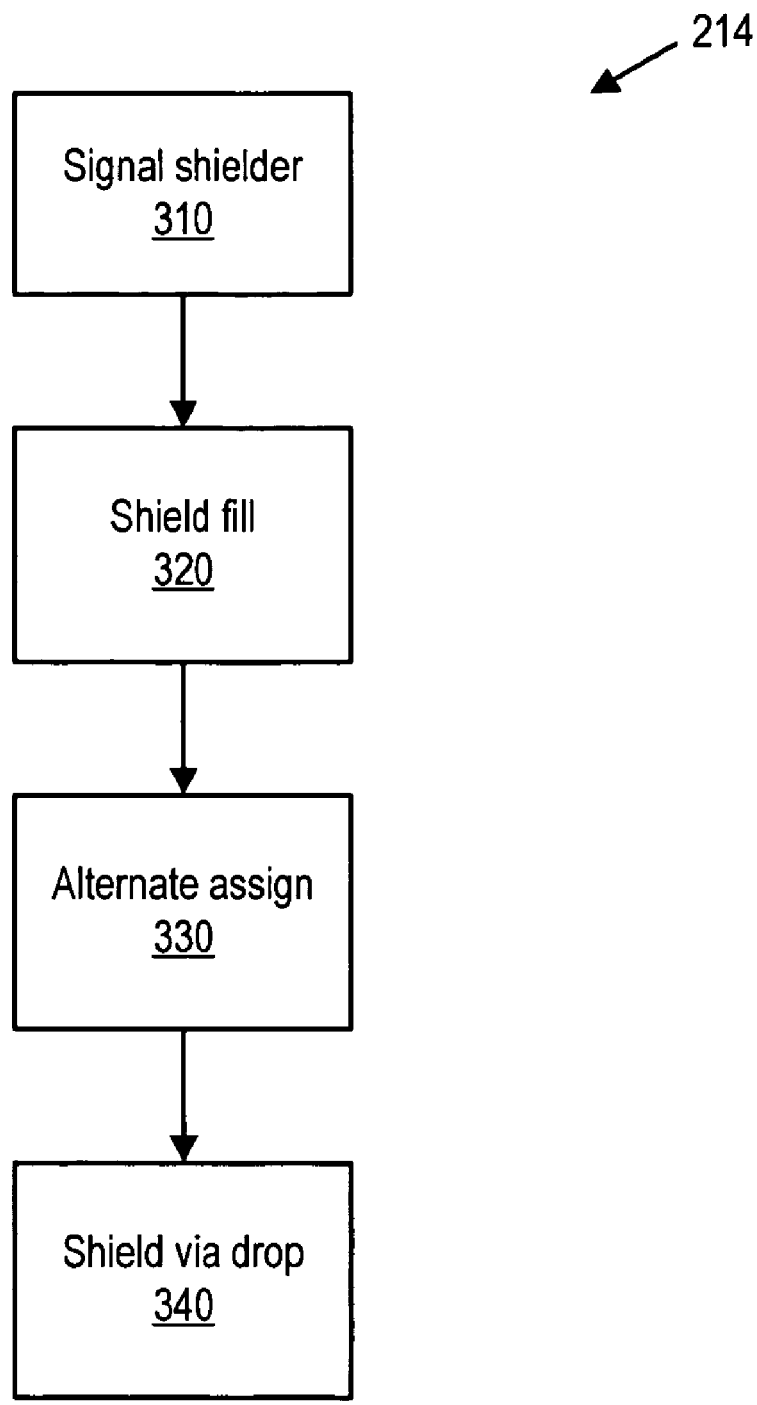
FIG. 3 shows the operation of a shielder module of the post processing module.

Referring to FIG. 3, a flow chart of the operation of a shielder module 214 of the post processing module is shown. The shielder module 214 operates within the design constraints set forth during step 110.

More specifically, the shielder module 214 starts by performing a signal shielder function at step 310, during which all signal paths are shielded. (Paths that don't require shielding are treated on an exception basis.) Next, a shield fill function is performed at step 320, during which shields are filled in open space regions of the design. Next, an alternate assignment function is performed at step 330, during which alternating power and ground wires are assigned. Next, a shield via drop function is performed at step 340, during which the shield and shield fill grids are interconnected with vias.

Figure 4:
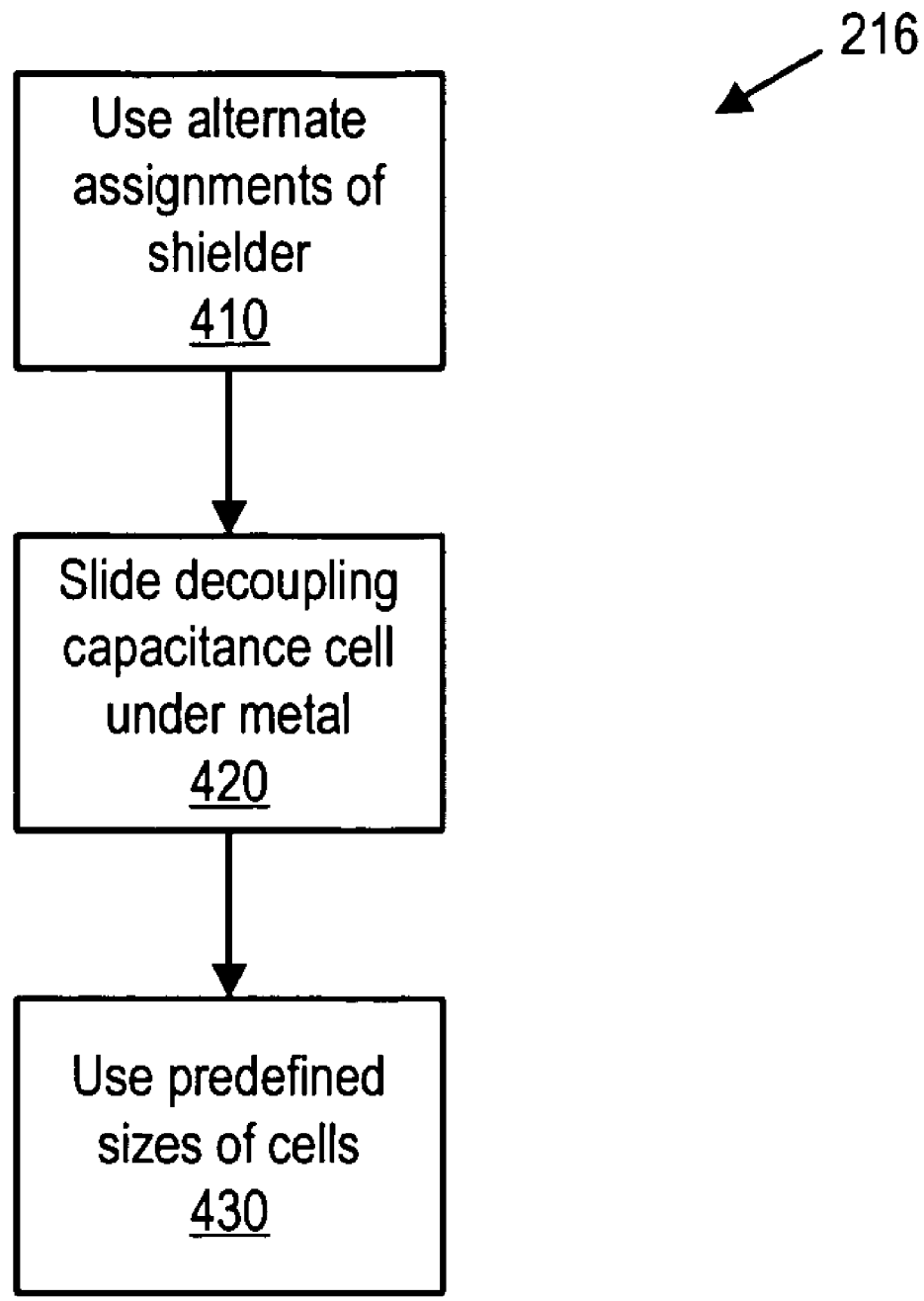
FIG. 4 shows a flow chart of the operation of a decoupling capacitance insertion module of the post processing module.

Referring to FIG. 4, a flow chart of the operation of a decoupling capacitance insertion module 216 of the post processing module is shown. The capacitance insertion module generally operates within the design constraints set forth during step 110.

More specifically, at step 420, alternate assignments of the shield are used to locate suitable positions for decoupling capacitors. Next, at step 420, the decoupling capacitance insertion module 216 slides decoupling capacitance cells under the lowest shield grid. Next, at step 430, the sizes of the various decoupling capacitors are assigned based upon the pitch of two adjacent (and alternately assigned) shield paths to which the decoupling capacitor is attached. (The pitch is defined in the binning table.)

Figure 5:
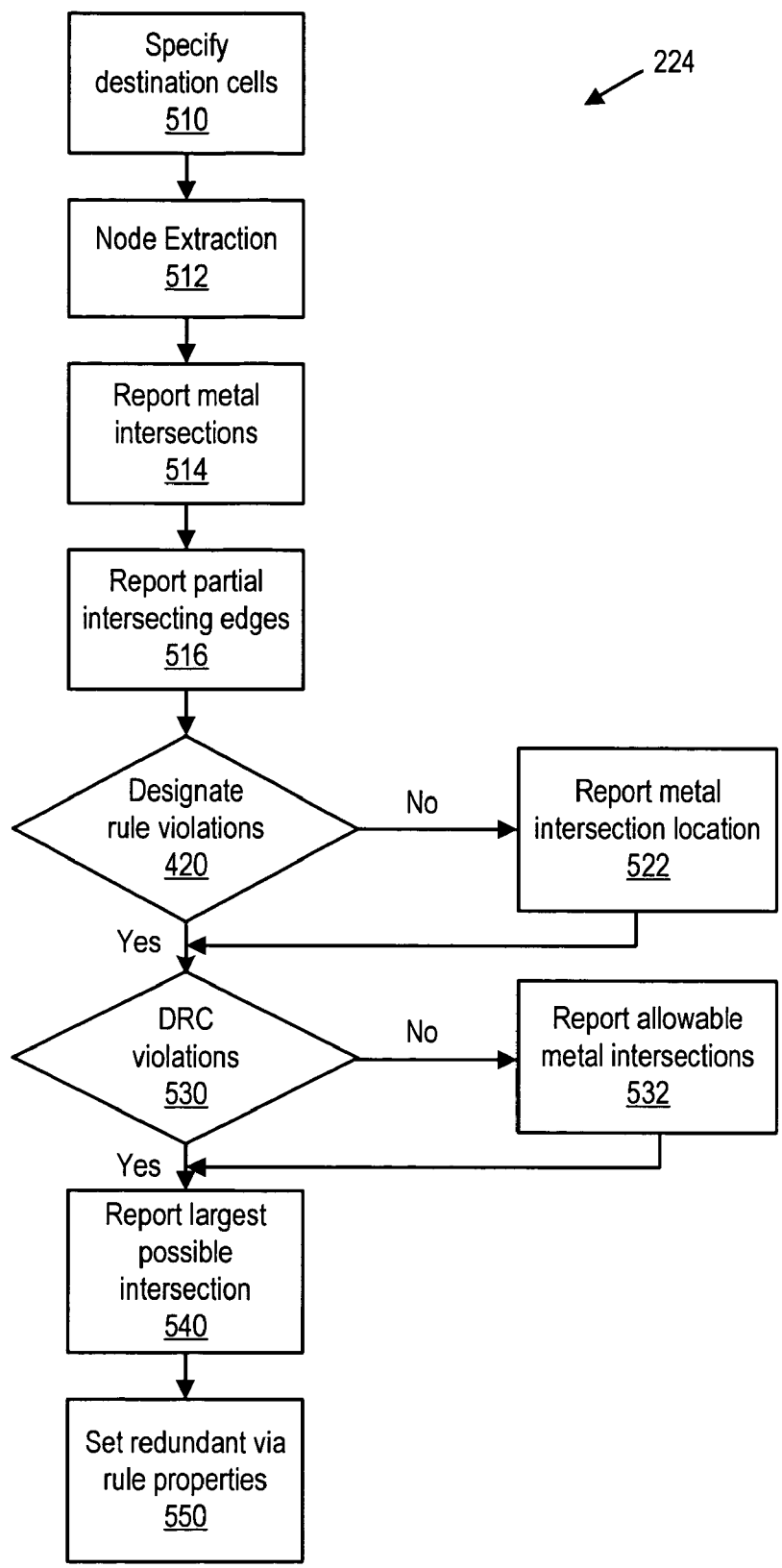
FIG. 5 shows the operation of a via drop module of the post processing module.

Referring to FIG. 5, a flow chart of the operation of a via drop module 224 of the post processing module is shown. More specifically, at step 510, the via drop module 224 uses an existing cell list as an input which allows the user to specify the destination cells, intended metal layers, and name of the nets on which vias may be dropped. At step 512 the via drop module 224 performs a node extraction function for each net with appropriate metal layers. The node extraction function creates a subset of a physical layout design where an extraction of a specific net (node) is provided such that a database is generated which allows for the insertion of vias for a particular node.

At step 514, the via drop module 224 reports metal intersections of adjoining metal layers (m1-m2, m2-m3, etc) with the same net name as long as the via instance does not introduce design rule violations. The relevant redundant via rule information is passed by reporting partial intersection edges and setting certain properties that will be processed by the core via placement tool at step 516.

The via drop module 224 designates whether there are any rule violations at step 420. To identify the location of allowed metal intersections based on design rule correctness, the via drop module 224 reports a metal intersection location only if inserting a via would not create any design rule violations as set forth by the design constraints. The via drop module 224 determines appropriate metal insertion locations at step 522 by examining the distance of the sides of the intersection to shapes nearby, to ensure that the current-location-via to existing-via spacing and metal-to-metal spacing comply with design rules. The via drop module 224 determines current location via information based on minimum metal enclosure of vias to be conservative.

The via drop module 224 determines whether there are any design rule violations at step 530. At step 532, the via drop module 224 only reports allowable metal intersections that will not cause DRC violations for any of a plurality of four cases. More specifically, the via drop module 224 determines whether the metal intersections represent a complete metal intersection, a partial metal intersection that enclose a via completely and do not violate a redundant via rule, a partial metal intersection that enclose a via completely but violate a redundant via rule.

A complete metal intersection is a metal intersection where the edges of the intersection coincide with real edges of the intersecting wires. All complete metal intersections are reported as long as they satisfy the design rules mentioned below. Partial metal intersections that enclose a via completely and do not violate redundant via rules may be defined as an intersection in which three edges coincide with exactly one metal shape. Partial metal intersections that enclose the via completely but violate the redundant via rules which can cause a wide wire redundant via rule violation.

The via drop module 224 reports the largest possible rectangle within a polygonal area of metal intersection at step 540. Here, there are three possible rectangular shapes of intersection between m1 and m2. The via drop tool only reports the largest rectangle in the middle.

At step 550, the via drop module 224 sets redundant via rule properties on the metal intersections wherever applicable. For example, the via drop module 224 can apply redundant via properties whenever the width of the lower wire in the intersection exceeds 1 µm for Via1-Via3, 2 µm for Via4-Via5 and 3 µm for Via6-Via7. The lower metal area would exceed 10 µm$^2$, 50 µm$^2$ and 60 µm$^2$ respectively for these rules to apply. In such a case, a property referred to as a via orient property is set to "MinUpper" and is associated with the resulting shape of the intersection.

Figure 6:
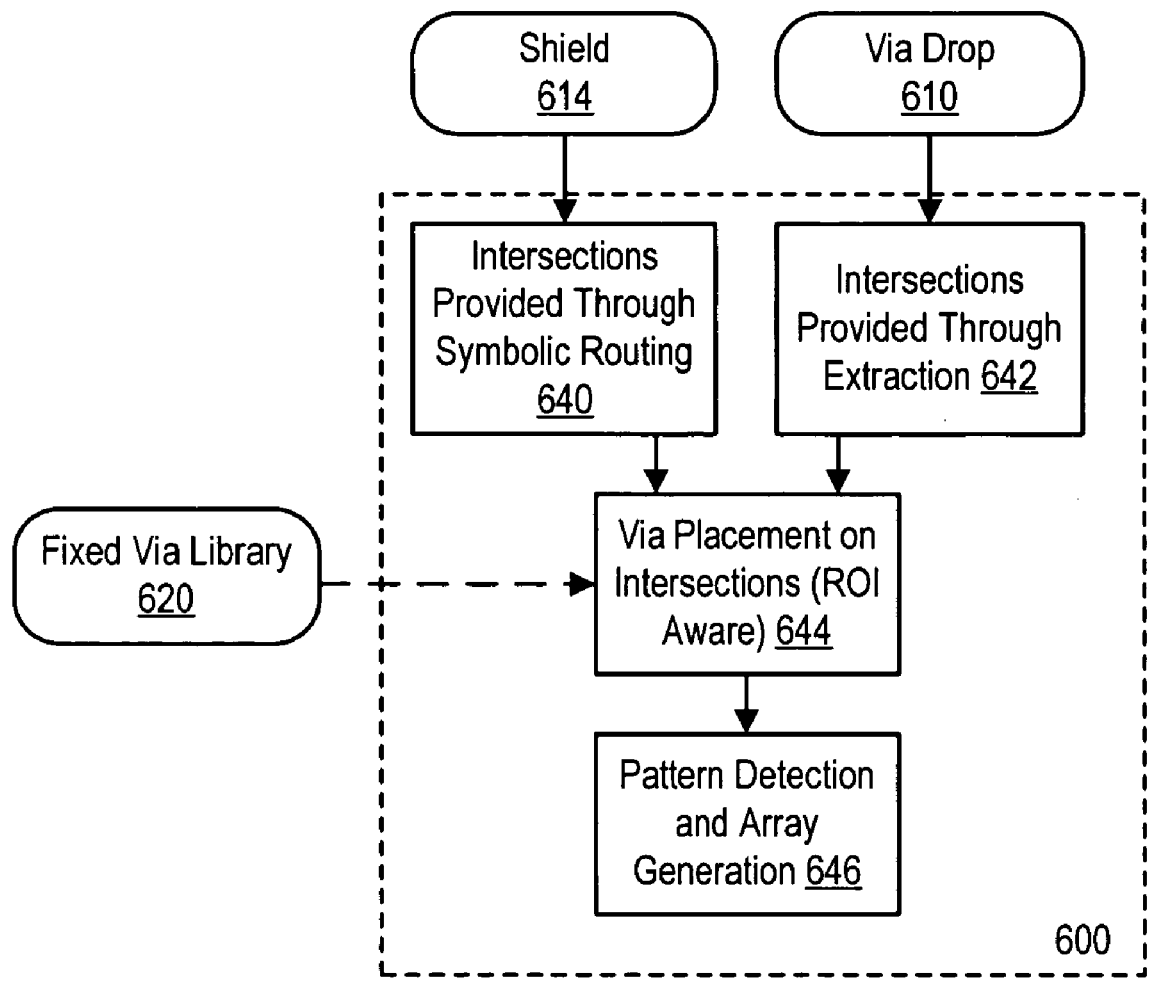
FIG. 6 shows a block diagram of one embodiment of a post processing module.

Referring to FIG. 6, a block diagram of a core via placement module 600 is shown. The core via placement module 600 receives via dropper information and a via dropper design constraints from a generic via drop module 610, shielder information from a shield via drop module 614, and fixed via information from fixed via library 620. The core via placement module 600 includes a symbolic routing module 640, an intersections module 642, a via placement module 644 and a pattern detection and array generation module 646.

In general, the integrated placement tool 600 addresses via insertion requirements for consolidating a via drop built into the shield tool and the via drop used by an integrated circuit designer.

The shielder information is provided by the shield via drop module 614 that inserts vias on symbolic shields. The via dropper information is provided by the generic via drop module 610. The generic via drop module 610 may include an off-the-shelf physical layout extraction tool used to generate a graphic design system (GDS) file.

The shielder information and the via dropper information are provided to the placement tool 600. The placement tool 600 takes metal intersection information from the via drop tool and route information from the shield tools. To minimize the time for generating a GDS file, layout database display time and database size, the core placement tool 624 uses predefined (i.e., fixed in size) vias from library 620 if the corresponding metal intersection matches in size. Otherwise, the core placement tool 624 instantiates parameterizable vias on the fly to cover that intersection appropriately. An instantiation of a parameterizable via includes the via information, the metal layer information as well as design information that allow a best possible metal layer interconnect while heeding all design rules. Thus, a layout design can be generated using vias with parameters such as width and height of the via. Once the parameters are specified, the layout view is adapted to that width and height with the appropriate amount and sizes of the metal layer interconnects.

The placement tool 600 consolidates the functionality of two via drop tools. The shield tool 614 passes symbolically routed shields which are processed by the core via placement tool 624 to obtain intersections from this database. The via drop tool 610 generates metal intersections through a physical layout extraction and passes this information to the placement tool 600. The placement tool 600 receives this information and generates correct by construction via placement.

The via drop tool 610 executes an extraction operation only once. The generation of the metal intersection information allows the core via placement tool 600 to identify locations for correct by construction via insertion without executing the design rule checker. The via drop tool 610 implements primitive redundant via rule checks but does not check if sufficient vias are inserted in a prescribed area. The via drop tool 610 does not implement incremental metal area checks. This responsibility is ultimately left to the designer.

The symbolic routing module 640 provides connectivity information that is attached to routing. Netlist information that is included within a physical design is used to allow symbolic routing. I.e., routed shapes are assigned to nets that are embedded in the physical layout design.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, the core placement tool 600 may be enhanced to provide spawning of different jobs for several temporary views in parallel.

Also for example, the above-discussed embodiments include modules and units that perform certain tasks. The modules and units discussed herein may include hardware modules or software modules. The hardware modules may be implemented within custom circuitry or via some form of programmable logic device. The software modules may include script, batch, or other executable files. The modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules and units is for illustrative purposes. Alternative embodiments may merge the functionality of multiple modules or units into a single module or unit or may impose an alternate decomposition of functionality of modules or units. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A method for binning and layout of an integrated circuit design comprising:

providing a table setting forth predefined widths of signal wires and corresponding spacing to shield wires, the shield wires being adjacent and on both sides of a routed signal wire;

characterizing effects on timing, noise, and power distribution based on predefined widths and spacing combinations as functions of the length of the signal wire; and, laying out the integrated circuit design based upon the predefined widths of signal wires and corresponding spacing to shield wires.

2. The method of claim 1 wherein the table includes widths for the shield wires associated with corresponding signal wires.

3. The method of claim 1 further comprising determining a capacitive effect on a particular signal wire.

4. The method of claim 1 further comprising determining a density of power that can be delivered by the shield wires in a particular region of the integrated circuit design.

5. The method of claim 1 wherein the laying out the integrated circuit design includes following a given spacing as determined for two adjacent signal wires.

6. The method of claim 1 wherein the laying out the integrated circuit design includes using an allowable wire width and routing direction as set forth by the table.

7. The method of claim 1 wherein the laying out the integrated circuit design includes inserting alternate shields adjacent to signals as defined by the table.

8. The method of claim 1 wherein the laying out the integrated circuit design includes filling wide open spaces uniformly with shield wires.

9. The method of claim 1 wherein the laying out the integrated circuit design includes assigning alternating power to the shield wires.

10. The method of claim 1 wherein the laying out the integrated circuit design includes inserting capacitor cells of various bin sizes according to the table.

11. An apparatus for binning and layout of an integrated circuit design comprising:

a table setting forth predefined widths of signal wires and corresponding spacing to shield wires, the shield wires being adjacent and on both sides of a routed signal wire, the table being stored on a computer readable media;

means for characterizing effects on timing, noise, and power distribution based on predefined widths and spacing combinations as functions of the length of the signal wire; and, means for laying out the integrated circuit design based upon the predefined widths of signal wires and corresponding spacing to shield wires.

12. The apparatus of claim 11 wherein the table includes widths for the shield wires associated with corresponding signal wires.

13. The apparatus of claim 11 further comprising means for determining a capacitive effect on a particular signal wire.

14. The apparatus of claim 11 further comprising means for determining a density of power that can be delivered by the shield wires in a particular region of the integrated circuit design.

15. The apparatus of claim 11 wherein the laying out the integrated circuit design includes following a given spacing as determined for two adjacent signal wires.

16. The apparatus of claim 11 wherein the laying out the integrated circuit design includes using an allowable wire width and routing direction as set forth by the table.

17. The apparatus of claim 11 wherein the laying out the integrated circuit design includes inserting alternate shields adjacent to signals as defined by the table.

18. The apparatus of claim 11 wherein the laying out the integrated circuit design includes filling wide open spaces uniformly with shield wires.

19. The apparatus of claim 11 wherein the laying out the integrated circuit design includes assigning alternating power to the shield wires.

20. The apparatus of claim 11 wherein the laying out the integrated circuit design includes inserting capacitor cells of various bin sizes according to the table.

* * * * *